(12) United States Patent
Gibb

(10) Patent No.: US 10,546,967 B2
(45) Date of Patent: Jan. 28, 2020

(54) MULTI-MISSION MODULAR ARRAY

(71) Applicant: Lockheed Martin Corporation, Bethesda, MD (US)

(72) Inventor: John L. Gibb, Sunnyvale, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/959,151

(22) Filed: Apr. 20, 2018

(65) Prior Publication Data

US 2018/0309008 A1    Oct. 25, 2018

Related U.S. Application Data

(60) Provisional application No. 62/488,683, filed on Apr. 21, 2017.

(51) Int. Cl.
| | |
|---|---|
| *H02S 30/20* | (2014.01) |
| *H01L 31/05* | (2014.01) |
| *H01L 31/02* | (2006.01) |
| *H02S 30/10* | (2014.01) |
| *B64G 1/44* | (2006.01) |
| *B64G 1/22* | (2006.01) |

(52) U.S. Cl.
CPC ......... *H01L 31/0504* (2013.01); *B64G 1/222* (2013.01); *B64G 1/44* (2013.01); *B64G 1/443* (2013.01); *H01L 31/02008* (2013.01); *H02S 30/10* (2014.12); *H02S 30/20* (2014.12)

(58) Field of Classification Search
CPC .......... B64G 1/222; B64G 1/44; B64G 1/443; H02S 30/20
See application file for complete search history.

(56) References Cited

U.S. PATENT DOCUMENTS

| | | | | |
|---|---|---|---|---|
| 3,627,585 A | * | 12/1971 | Dollery ................. | B64G 1/222 136/245 |
| 4,690,355 A | * | 9/1987 | Hornung ................ | B64G 1/222 244/172.8 |
| 5,833,176 A | * | 11/1998 | Rubin .................... | B64G 1/222 244/172.7 |
| 5,857,648 A | * | 1/1999 | Dailey .................... | B64G 1/22 244/172.6 |
| 5,961,738 A | * | 10/1999 | Benton .................... | B64G 1/44 136/245 |

(Continued)

*Primary Examiner* — Philip J Bonzell
(74) *Attorney, Agent, or Firm* — Morgan, Lewis & Bockius LLP

(57) ABSTRACT

A system for compact stowage and deployment of a flexible solar array includes a deployer unit and a blanket container for containing the flexible solar array. The deployer unit includes a frame, a closed-section collapsible mast for deploying and supporting the solar array, a mast stowage reel for supporting the mast in a collapsed stowed state, and an actuator to drive the mast from the stowed state to a deployed state. The frame has a first section extending along a vertical plane and a second section extending along a horizontal plane. The blanket container is pivotably coupled to the frame of the deployer unit. In a stowed state, the blanket container is oriented facing the second section of the frame. In a deployed state, the blanket container is oriented parallel to the vertical plane, and perpendicular to a longitudinal axis of the mast.

11 Claims, 12 Drawing Sheets

(56) References Cited

U.S. PATENT DOCUMENTS

| | | | | |
|---|---|---|---|---|
| 8,683,755 B1* | 4/2014 | Spence | ............ | B64G 1/222 |
| | | | | 136/245 |
| 8,816,187 B1* | 8/2014 | Stribling | ............ | H02S 30/20 |
| | | | | 136/245 |
| 9,346,566 B2* | 5/2016 | Spence | ............ | B64G 1/222 |
| 9,604,737 B2* | 3/2017 | Spence | ............ | B64G 1/222 |
| 9,831,366 B1* | 11/2017 | Stribling | ............ | H02S 30/20 |
| 2014/0150863 A1* | 6/2014 | Spence | ............ | B64G 1/222 |
| | | | | 136/256 |
| 2014/0326833 A1* | 11/2014 | Spence | ............ | B64G 1/222 |
| | | | | 244/172.7 |
| 2015/0144740 A1* | 5/2015 | Turse | ............ | B64G 1/44 |
| | | | | 244/172.6 |

* cited by examiner

MULTI-MISSION MODULAR ARRAY

CROSS-REFERENCE TO RELATED APPLICATIONS

This application claims priority under 35 U.S.C. § 119 to Provisional Application No. 62/488,683 filed on Apr. 21, 2017, the entirety of which is incorporated herein by reference.

STATEMENT REGARDING FEDERALLY SPONSORED RESEARCH OR DEVELOPMENT

Not applicable.

TECHNICAL FIELD

The disclosure including accompanying figure(s) ("disclosure") relates in general to solar arrays, and in particular to, for example, without limitation, lightweight flexible solar arrays such as multi-mission modular arrays.

BACKGROUND

The description provided in the background section, including without limitation, any problems, features, solutions or information, should not be assumed to be prior art merely because it is mentioned in or associated with the background section. The background section may include information that describes one or more aspects of the subject technology.

Space solar arrays have been in use for over 50 years, dating back to the Vanguard satellite launched in 1958. Lightweight "flexible" substrate space solar arrays have been in use for over 30 years, dating to the Solar Array Flight Experiment (SAFE), flown on the Space Shuttle in 1985. The largest and most powerful solar arrays in use are of similar flexible substrate type, on the International Space Station (ISS). These arrays have been in use for over 10 years.

Flexible arrays have typically provided improvements in stowed volume and reduced mass compared to conventional "rigid" panel arrays. Properties such as reduced volume and mass are important to spacecraft designers interested in maximizing payload volume and mass of conventional arrays. However, disadvantages in providing the aforementioned properties as improvements to conventional arrays generally take the form of increased mechanical complexity and cost. In particular, flexible array costs are driven by mechanically complex deployer assemblies that create a large structural spar or mast from a compact stowed assembly.

Numerous deployment methods have been used in conventional flexible substrate arrays, including open-section lenticular struts, nesting open section lenticular struts, and tri and quad-longeron lattice masts. However, these methods have presented drawbacks in terms of reduced stiffness, higher weight, and great complexity. In addition, the advent of higher power and higher voltage solar arrays has exposed reliability issues associated with solar particle charging leading to arcing discharges on the arrays.

SUMMARY

In one or more implementations, a system for compact stowage and deployment of a flexible solar array is provided that includes a deployer unit and a blanket container for containing the flexible solar array. The deployer unit includes a closed-section collapsible mast for deploying and supporting the solar array, a mast stowage reel for supporting the mast in a stowed state, and an actuator coupled to the mast to drive the mast from the stowed state to a deployed state. The stowage reel includes a pair of wheels interposed by a plurality of rods coupling the pair of wheels to each other, and the collapsible mast configured to be reeled about the plurality of rods in the stowed state. The blanket container is rotationally coupled to a structural frame of the deployer unit. In a stowed state of the blanket container, a side surface thereof is oriented facing the structural frame. In a deployed state of the blanket container, the side surface is oriented perpendicular to a longitudinal axis of the mast.

In one or more implementations, a solar array comprising is provided that includes a semi-conductive substrate blanket material, a plurality of solar cells mounted to the semi-conductive substrate blanket material to form a solar power supply network, and a series of circuit paths formed on the semi-conductive substrate blanket material. The series of circuit paths are formed for electrically connecting the solar cells together within the solar power supply network. The flexible semi-conductive substrate blanket material is configured to (1) dissipate current across the power supply network to minimize solar arcing and (2) isolate power circuits within the power supply network.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION

It is understood that various configurations of the subject technology will become readily apparent to those skilled in the art from the disclosure, wherein various configurations of the subject technology are shown and described by way of illustration. As will be realized, the subject technology is capable of other and different configurations and its several details are capable of modification in various other respects, all without departing from the scope of the subject technology. Accordingly, the summary, drawings and detailed description are to be regarded as illustrative in nature and not as restrictive The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

I. Systems for Compact Stowage and Deployment of Solar Array

Figure 1:
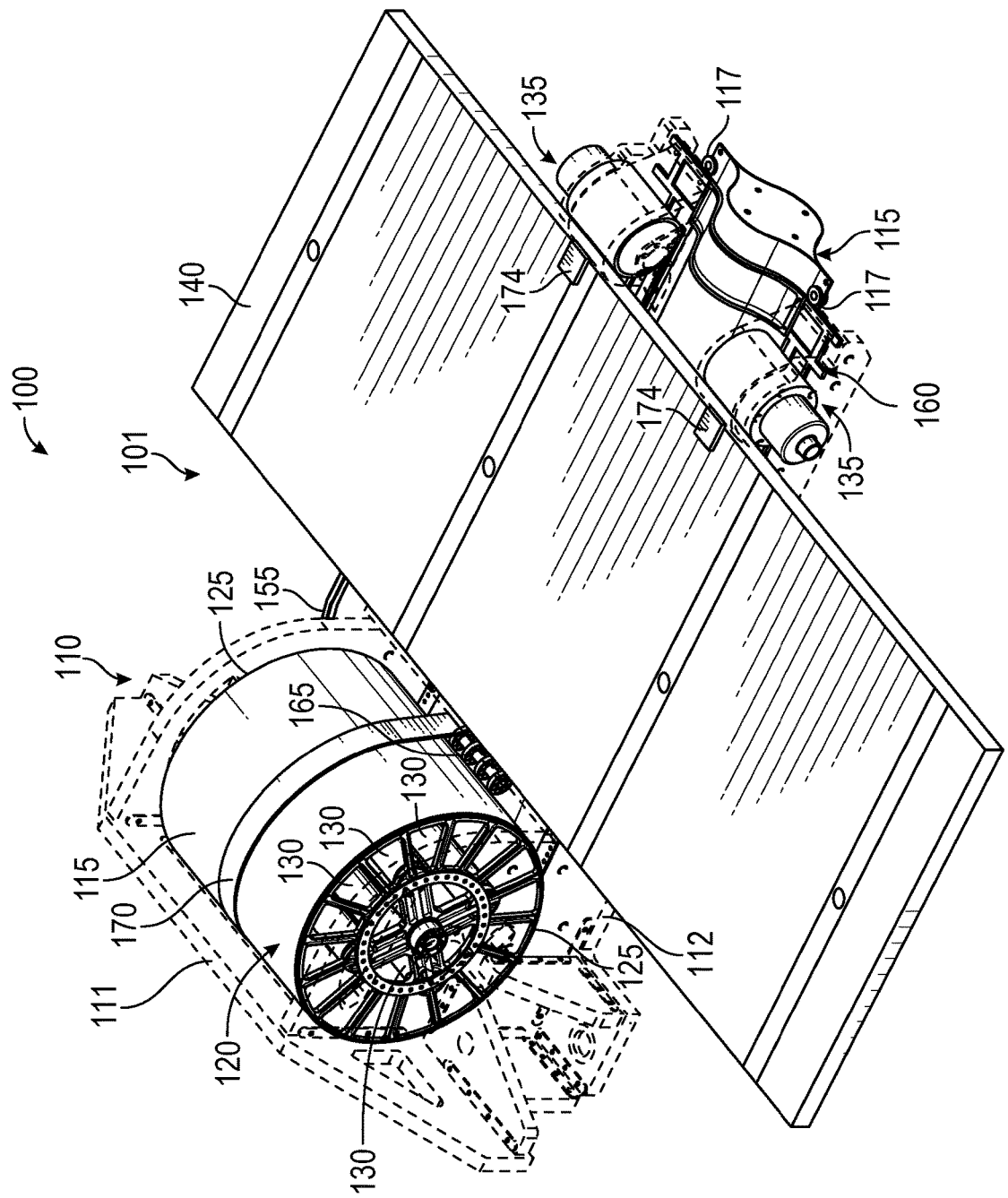
FIG. 1 illustrates a system for compact stowage and deployment of a flexible solar array, according to some embodiments of the present disclosure.
Figure 2:
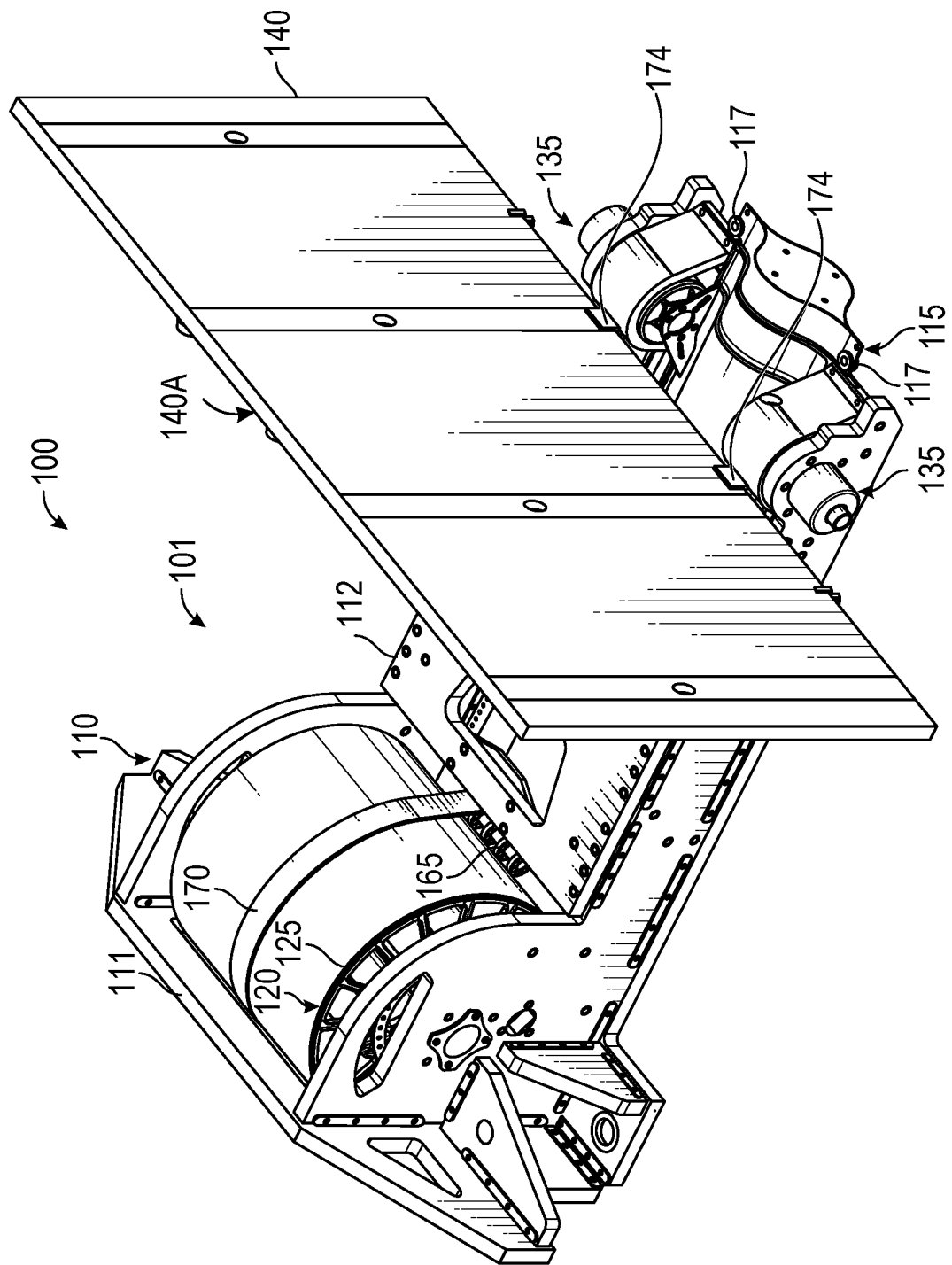
FIG. 2 illustrates the system of FIG. 1 with a deployed blanket container containing the flexible solar array prior to deployment of the array, according to some embodiments of the present disclosure.

FIG. 1 illustrates a system for compact stowage and deployment of a flexible solar array, according to some embodiments of the present disclosure. FIG. 2 illustrates the system of FIG. 1 with a deployed blanket container containing the flexible solar array prior to deployment of the array, according to some embodiments of the present disclosure. According to various aspects of the present disclosure, as illustrated in FIGS. 1 and 2, a system 100 for compact stowage and deployment of a flexible solar array may include a deployer unit 101 and a blanket container 140 for containing the flexible solar array. As depicted, the deployer unit 101 has a frame 110 having a first section 111 extending along a vertical plane and a second section 112 extending along a horizontal plane.

A. Hinged Blanket Container

In the depicted embodiments, the blanket container 140 is pivotably coupled to the second section 112 of the frame 110 through at least one hinge 174. This configuration advantageously allows for the blanket container to be rotatable about an axis X1 (illustrated in FIG. 9A) between a stowed position during launch (illustrated in FIG. 9), and an upright deployed position prior to deployment of the solar array (illustrated in FIG. 2). As illustrated in FIG. 1, in the stowed position, the blanket container 140 may be oriented facing the second section 112 of the frame 110. In the depicted example, the blanket container 140 is disposed lying flat against, or directly above the second section 112 of the frame 110. This configuration is advantageous as the overall size (height) of the system 100 is minimized during launching, prior to deployment. As illustrated in FIG. 2, in the upright deployed position, prior to deployment of the solar array, the blanket container 140 is oriented parallel to the vertical plane, and perpendicular to a longitudinal axis of the mast 115.

In contrast, currently existing solar array containment and stowage systems are typically designed with the blanket container and the deployer fixed at right angles relative to each other, with the blanket container in the upright position. Since the orientation of the blanket container relative to the deployer is fixed, it remains this way during launching and deployment. Thus, currently existing systems take up more stowed volume and lack the ability for compact stowage of the blanket container in comparison with the systems and methods of the various embodiments described herein.

B. Deployer Unit

1. Closed-Section Lenticular Mast

As illustrated in FIGS. 1 and 2, the deployer unit 101 may include a closed-section collapsible mast 115 for deploying and supporting the solar array, a stowage reel 120 for supporting the mast in a stowed state, and an actuator 135 coupled to the mast 115 to drive the mast 115 from the stowed state to a deployed state.

Figure 3:
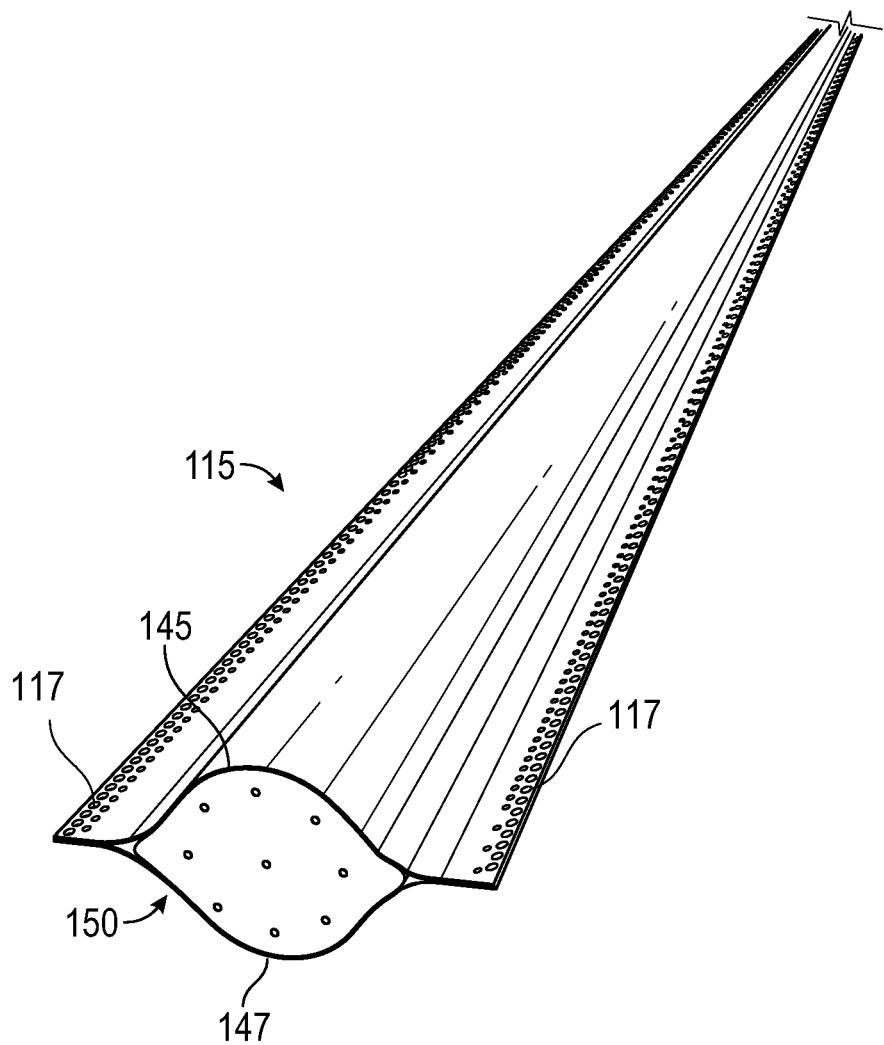
FIG. 3 illustrates a perspective view of a closed-section mast of the system of FIG. 1, according to some embodiments of the present disclosure.

FIG. 3 illustrates a perspective view of a closed-section mast of the system of FIG. 1, according to some embodiments of the present disclosure. As depicted, the mast 115 includes a plurality of grommets 117. In operation, the grommets 117 are engaged by the protrusions 136 of the rotating interface 135 (illustrated in FIGS. 7A-7C) to drive and deploy the mast 115. In some embodiments, the closed-section mast 115 may be fabricated by bonding first and second mast shells 145, 147 together. As bonded, the two shells 145, 147 form a lenticular cross-sectional shape capable of withstanding both torsional and bending loads. In some embodiments, the first and second mast shells 145, 147 may be composite shell structures that are cured with a continuous layer of carbon fiber. The aforementioned configuration advantageously yields a mast formed with reduced part count, and having the capability to withstand occurrence of lengthwise splices thereon. In contrast, conventional tri and quad longeron lattice masts traditionally include multiple pieces which require lengthwise splice-joints in order for the masts to be rolled up and stowed. Further, the lengthwise splice-joints can fail on orbit due to load and thermal cycling.

The aforementioned configuration provides advantages over conventional composite masts that are traditionally formed of one shell structure (e.g., a tube wrapped mandrel), these masts typically require a slit lengthwise to remove the mast from the mold (after manufacture) and to roll up to stow in orbit. The lengthwise slit makes an "open section" mast which has no torsion capability. Further, conventional composite masts traditionally include multi-piece masts in fixed length autoclaves requiring lengthwise splice-joints which can fail on orbit due to load and thermal cycling. The various aspects of this disclosure present a solution to the aforementioned deficiencies by providing the closed-section mast which uses fewer parts than conventional tri and quad longeron lattice masts. In addition, the lenticular closed-section structure of the mast is capable of supporting both bending and torsional loads with a single deployer and mast per array, which open (i.e., slit) masts cannot efficiently support without collapsing.

In some embodiments, the mast 115 may be formed of a light-weight material having a low co-efficient of thermal expansion (CTE). For example, the mast 115 may be formed of, but not limited to, a carbon fiber material. This is in contrast to conventional composite masts formed of metallic elements, and which are generally heavier and have a higher CTE than carbon fiber material. The higher CTE is disadvantageous in that the mast can be adversely affected by extreme heating and cooling based on period of on-and-off exposure to the sun. In other embodiments, the mast 115 may be formed of an aramid fiber material, a carbon and aramid fiber blend material, or a glass fiber material.

Figure 4:
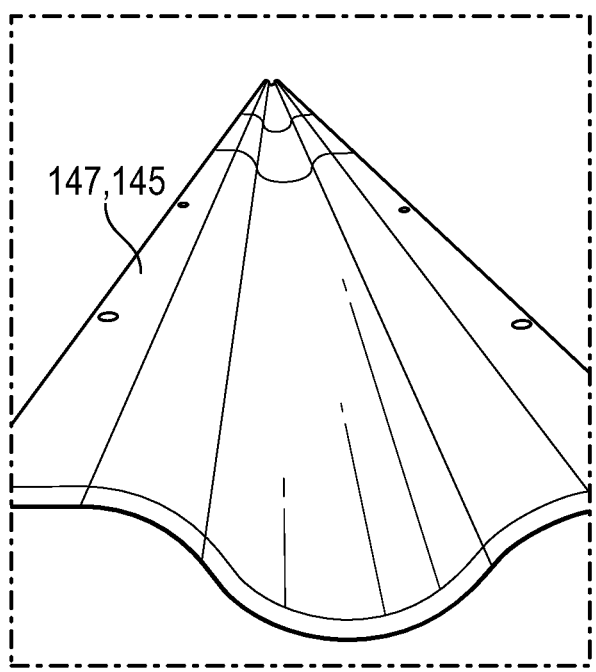
FIG. 4 illustrates one of the first and second first and second halves of the closed-section mast of FIG. 3, according to some embodiments of the present disclosure.

FIG. 4 illustrates one of the first and second first and second halves 145, 147 of the closed-section mast of FIG. 3, according to some embodiments of the present disclosure. In accordance with some embodiments, the mast 115 may be formed using a mold 148 to mold a continuous layer of carbon fiber material in an out-of-autoclave process. This method of manufacture is advantageous in that the length of the mast 115 is not limited by the size of the autoclave pressure vessel, as with conventional masts. Conventional methods of forming masts generally involve processing and curing the composite mast material in an autoclave pressure vessel. However, the autoclave vessels are generally limited in size to a maximum of 60 feet long. The various embodiments described herein thus are capable of producing lenticular masts lengths which are greater than 60 feet long, due to the out-of-autoclave manufacturing process.

Figure 5:
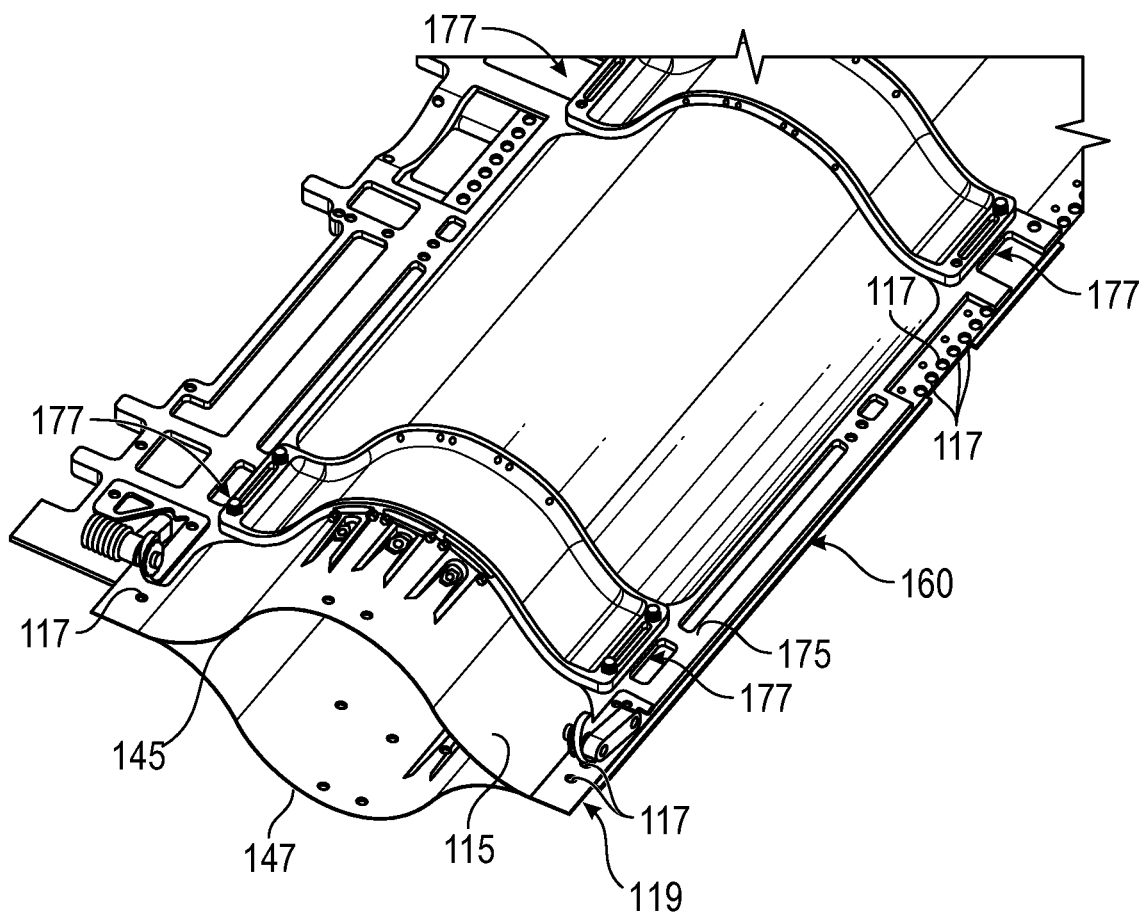
FIG. 5 illustrates a perspective view of a sleeve for supporting the mast of the system of FIG. 1, according to some embodiments of the present disclosure.

FIG. 5 illustrates a perspective view of a sleeve for supporting the mast of the system of FIG. 1, according to some embodiments of the present disclosure. In some embodiments, the system 100 further includes sleeve 160 for anchoring and strengthening the mast 115 in the deployed state. Due to the collapsible nature of the mast 115, the sleeve 160 is provided to reinforce the stiffness of the mast 115 in the deployed state. To this effect, the sleeve has a shape which corresponds to the shape of the mast 115. For example, the sleeve 160 is designed with an inner perimeter that is slightly larger than an outer perimeter of the mast 115 so as to allow the mast 115 to be inserted into the sleeve 160 as illustrated in FIG. 5. As depicted, the sleeve 160 is disposed over the outer perimeter of the deployed mast 115. In particular, the sleeve 160 includes a linear portion and a plurality of curved portions coupled to, and extending along the length of the linear portion. In the deployed state, the linear portion is disposed over the flanges 119 of the mast 115 and extends partially along the length of the deployed mast 115. In particular, the sleeve 160 extends along the length, and up to the end of the second section 112 of the frame 110. The curved portions extend over the first and second mast shells 145, 147 and have the same curvature as the first and second mast shells 145, 147. The sleeve may thus provide enhanced deployed stiffness and strength to the flexible mast by providing peripheral base support at at least eight points along the length of the mast 115. The aforementioned configuration is advantageous in preventing significant buckling and collapse of the mast 115, thereby strengthening the deployed mast 115 to withstand higher loads.

In some embodiments, the sleeve 160 may be lined with a material configured to reduce friction between the mast and the sleeve. As the mast 115 is deployed into the sleeve 160, the outer perimeter of the sleeve rubs against the inner perimeter of the sleeve. In order to reduce friction between the mast 115 and the sleeve 160, the inner perimeter of the sleeve 160 is lined with a material which reduces friction, e.g. Teflon.

2. Mast Stowage Reel

Figure 6A:
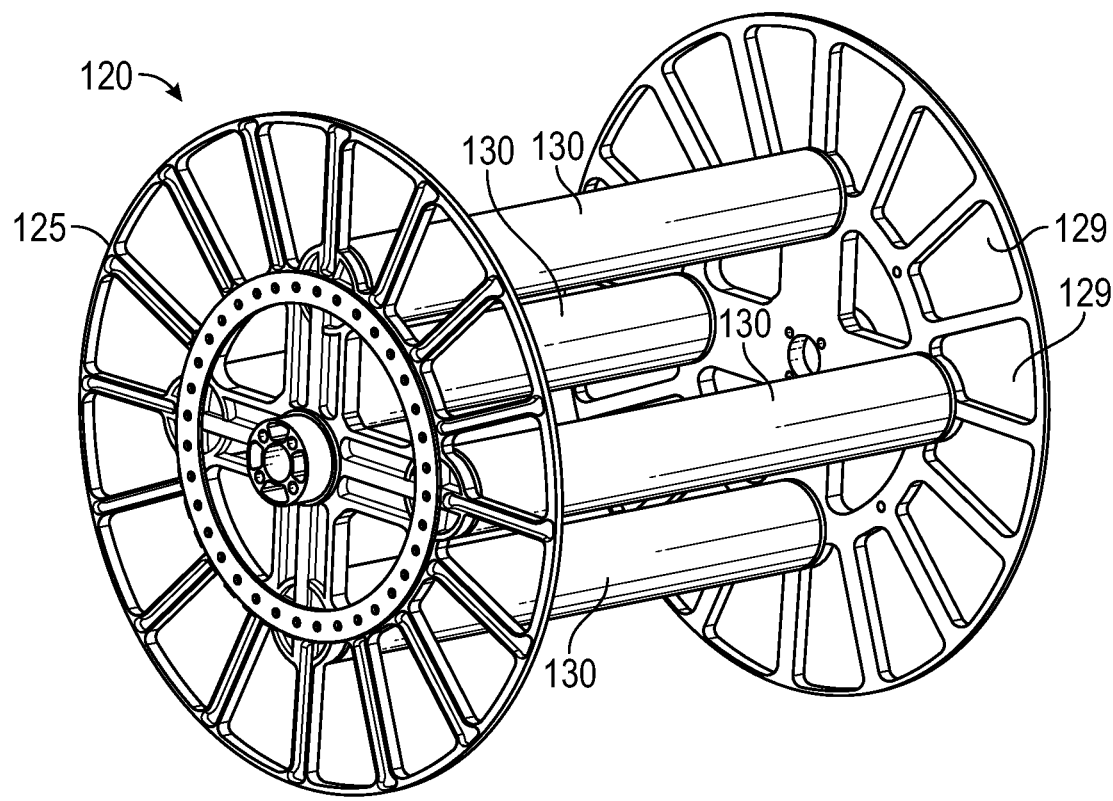
FIG. 6A illustrates a first perspective view of a mast stowage reel of the system of FIG. 1, according to some embodiments of the present disclosure.

FIG. 6A illustrates a first perspective view of a mast stowage reel of the system of FIG. 1, according to some embodiments of the present disclosure. Prior to deployment, the mast 115 is stowed at least partially on the stowage reel 120 in a collapsed and flattened configuration. Whilst being retracted from the deployed phase to the stowed phase, the mast 115 is passed through pinch rollers 165 (illustrated in FIG. 1) to flatten the for storage on the stowage reel 120. In the depicted embodiments, the stowage reel 120 is a lightweight body including a pair of wheels 125 interposed by a plurality of rods 130 which couple wheels 125 to each other. To further reduce the weight of the stowage reel 120, each of the rods 120 may be hollow tubular rods. Additionally, the tubes 130 may be formed of a lightweight material, for example, but not limited to, carbon fiber or aluminum. In the depicted embodiments, the stowage reel 120 includes four rods 130 equally spaced from each other circumferentially about a rotational center of the wheels 125. However, the various embodiments described herein are not limited to this configuration. The reel 120 may alternatively include less than four rods 130, or more than four rods 130 which are equally spaced apart from each circumferentially about a rotational center of the wheels 125. As depicted, the weight of the wheels 125 of the stowage reel 120 may further be reduced by forming the wheels 125 with a plurality of cut-outs 129 similar to spokes of a bicycle wheel.

Figure 6B:
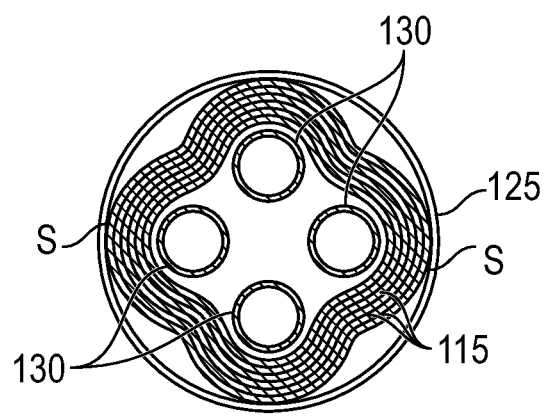
FIG. 6B is a cross-sectional view of the mast stowage reel of the system of FIG. 1 with the mast stowed thereon, according to some embodiments of the present disclosure.

FIG. 6B is a cross-sectional view of the mast stowage reel of the system of FIG. 1 with the mast stowed thereon, according to some embodiments of the present disclosure. In the stowed state, at least a portion of the mast 115 is stowed on the reel 120. In particular, as illustrated in FIG. 6B, the mast 115 is reeled around the rods 130. In operation, the mast 115 may be retracted from the deployed state to the stowed and stowed as a flattened sheet on the reel 120 using a set of pinch rollers 165 (illustrated in FIGS. 1 and 2). The pinch rollers 165 are actuated to flatten the collapsible mast 115 to a planar form which is flexible enough to be stowed on the reel 120. During deployment, the mast 115 expands back to the almost strain-free state.

In the stowed state, the mast 115 is biased to expanding outwards toward its original non-flattened (deployed) shape, thereby causing "strain pockets" S at various positions on the stowed mast 115. As illustrated in FIG. 6B, since the mast 115 is stowed about the rods 130, the stowage reel 120 of the present disclosure advantageously allows the stowed mast 115 to expand and bulk out as necessary at the various positions S. Thus, the open reel structure with supporting rods 130 advantageously allows for localized deformation of the stowed mast in response to the high strain stowed conditions. The various embodiments described herein thus provide a deployment system having lighter weight as compared to conventional deployment systems. To achieve this, the storage drum for the mast is structured as an open reel so as to allow for localized deformation of the stowed mast in response to high strain stowed conditions. The aforementioned configuration provides further advantages over conventional stowage drums for masts which are traditionally closed-section drums which are heavier, impose geometric constraints on the inside of the stowed mast, and can increase local strain and stress thereby causing damage to the stowed structure.

In some embodiments, the system 100 may further include a constraint band 170 (illustrated in FIGS. 1 and 2) to prevent the mast 115 stowed on the stowage reel 120 from unreeling prior to deployment. In the stowed state of the mast, the constraint band 170 may be tensioned uniformly by a constant force spring system (not shown). When the mast is ready to be deployed, the constraint band is released and retracted into a compartment in the frame 110. The aforementioned configuration is advantageous over conventional mast stowage systems in that a constant force spring system tensions the band uniformly even though the mast diameter is reduced as it deploys. The aforementioned configuration also accounts for any uneven "lobing" effect of the open reel drum.

Figure 6C:
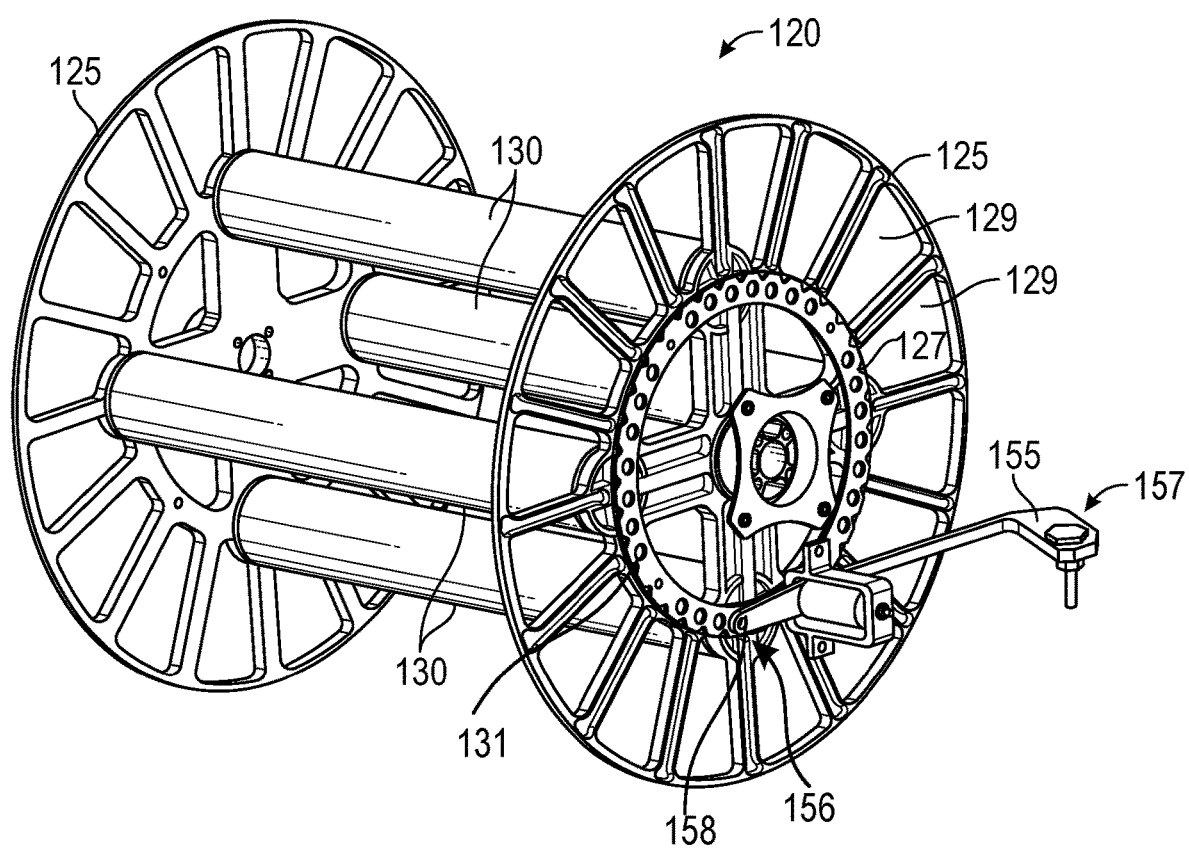
FIG. 6C illustrates a second perspective view of the mast stowage reel of the system of FIG. 1, according to some embodiments of the present disclosure.

FIG. 6C illustrates a second perspective view of the mast stowage reel of the system of FIG. 1, according to some embodiments of the present disclosure. As illustrated in FIG. 6C, the mast stowage reel may further include a latch 155 configured to maintain the mast stowage reel 120 in a locked position to prevent rotation during launch. The latch 155 includes a first end 156 having a pin 158 protruding therefrom, and a second end 157. Additionally, each of the wheels 125 may include a notch surface 127 including a plurality of notches 131. During launch, at least a portion of the container 140 rests on the latch 155, thereby applying a downward force on the latch 155. The downward force on the latch 155 maintains the pin 158 in engagement with the one of the notches 131, thereby locking the reel and preventing rotation thereof during launch. When the blanket container 140 is rotated to the upright position in preparation for deployment, as illustrated in FIG. 2, the force is removed from the latch 155 and the pin 158 disengages from the notch 131. The reel 120 is then free to rotate as the mast 115 is deployed.

The aforementioned configuration provides advantages over conventional stowage methods employing traditional storage drums in that the drum latch is configured to be passively actuated as a result of the blanket container being deployed. Thus, the drum latch of the various embodiments described herein does not require a separate pin-puller or other actuator that could cause reliability issues, as is the case with traditional storage drums.

3. Actuator System

Figure 7A:
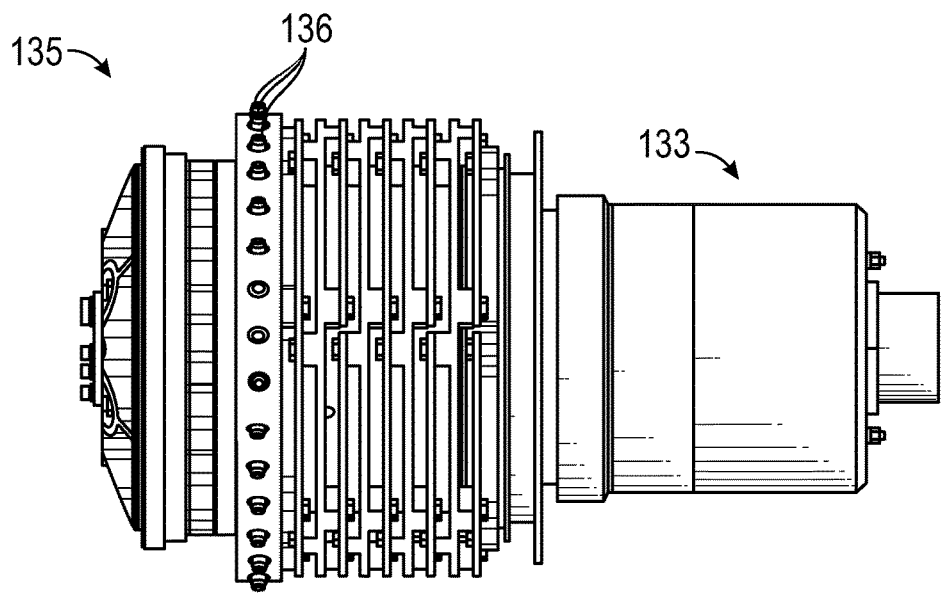
FIG. 7A illustrates a side view of an actuator of the system of FIG. 1, according to some embodiments of the present disclosure.
Figure 7B:
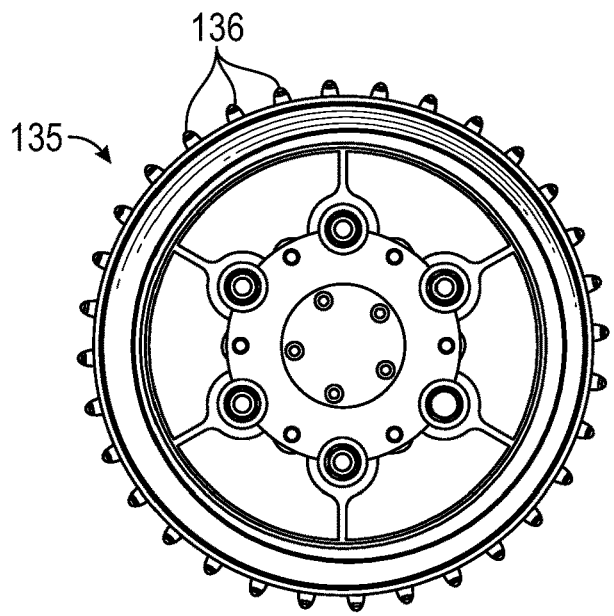
FIG. 7B illustrates a front view of the actuator of the system of FIG. 1, according to some embodiments of the present disclosure.
Figure 7C:
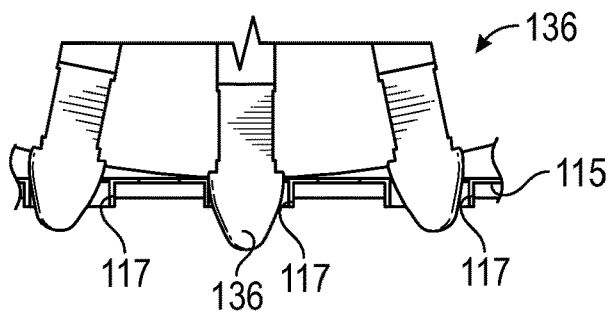
FIG. 7C illustrates an enlarged partial view of the actuator engaged with the mast of the system of FIG. 1, according to some embodiments of the present disclosure.

FIG. 7A illustrates a side view of an actuator of the system of FIG. 1, according to some embodiments of the present disclosure. FIG. 7B illustrates a front view of the actuator 135 of the system of FIG. 1, according to some embodiments of the present disclosure. FIG. 7C illustrates an enlarged partial view of the actuator 135 engaged with the mast 115 of the system of FIG. 1, according to some embodiments of the present disclosure. The actuator 135 is configured to drive deployment of the mast 115 from the stowed state to a deployed state. As depicted, the actuator 135 includes a motor 133 and a rotating interface 134. The rotating interface 133 include a plurality of protrusions 136 which are configured to engage the grommets 117 of the mast 115 to drive deployment and retraction of the mast 115 as desired. The actuator 135 is advantageously reversible on orbit to facilitate both retraction and deployment of the mast. The deployer unit may further include a controller communicatively coupled to the actuator 135 for deployment and retraction of the mast 115 and the mast 115 upon a control command of the controller.

II. Flexible Solar Array

A. Flexible Semi-Conductive Substrate Blanket Material

Figure 8:
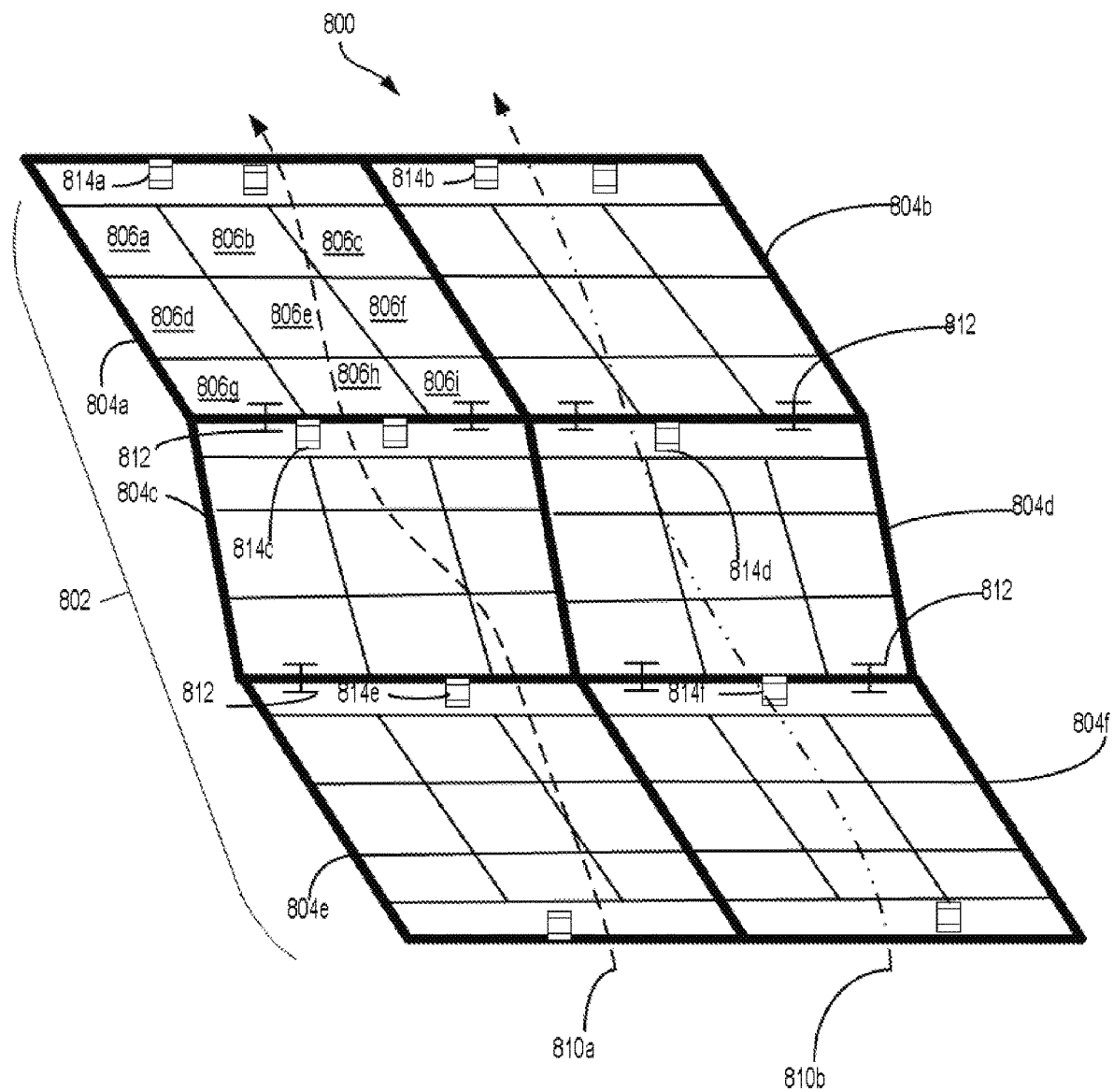
FIG. 8 illustrates a flexible solar array contained in the blanket container of the system of FIG. 1, according to some embodiments of the present disclosure.

FIG. 8 illustrates a flexible solar array 800 contained in the blanket container 140 of the system of FIG. 1, according to some embodiments of the present disclosure. As depicted, the flexible solar array 800 includes a flexible semi-conductive substrate blanket material 802 on which a plurality of solar cells, e.g., 806a-806i are mounted or fabricated. The plurality of solar cells 806a-806i are mounted to the flexible semi-conductive substrate blanket material 802 to form a solar power supply network of the flexible solar array 800. For example, the flexible solar array 800 may include a plurality of panels 804a-804f. Each panel 804a-804f may include a set of solar cells 806a-806i. As depicted, each panel 804a-804f includes nine solar cells 806a-806i. However, the aforementioned configuration is not limited thereto, and the panels 804a-804f may include more or less solar cells as desired.

In contrast to conventional substrate blankets which are traditionally formed of a non-conductive yellow/gold Kapton material, the flexible semi-conductive substrate blanket material 802 is made of charge dissipative material (e.g., charge dissipative Kapton, black Kapton or a charge dissipative polyimide). In some embodiments, charge dissipative Kapton may be formed by adding indium tin oxide (ITO) to the conventionally used yellow or gold Kapton to increase the conductivity of the yellow or gold Kapton so that the resultant Kapton material is charge dissipative.

The flexible substrate blanket of the various embodiments described herein includes improvements over the state of the art to minimize solar array charging and dissipation via arcing discharges. To achieve this, the flexible substrate blanket 802 may include a semi-conductive, charge dissipative black poly (4,4'-oxydiphenylene-pyromellitimide) "Kapton" material that reduces or eliminates on-orbit arcing by bleeding charge to the power circuit so as to prevent high voltage potentials from occurring. The semi-conductive, charge dissipative flexible blanket substrate material is additionally capable of isolating the power circuits sufficiently to avoid short circuits. The aforementioned configuration is advantageous relative to conventional non-conductive yellow or gold Kapton material which is susceptible to electrostatic discharge (arcing).

In some embodiments, the black Kapton achieves a balance between being conductive and non-conductive such that desirable power, current or voltage to be transmitted through the flexible solar array 800 (cells and panels) is not lost through dissipation. The black Kapton is conductive enough to dissipate the arc or undesirable energy spike throughout the black Kapton substrate such that the voltage seen by cells 806a*i-i* of the solar array 802 is maintained as a very small voltage potential. For example, the excess charge resulting from the arc or undesirable energy spike is dissipated throughout the power circuits of the flexible solar array 800.

In the depicted embodiments, the flexible semi-conductive substrate blanket material 802 is a foldable flexible substrate. For example, foldable flexible substrate blanket material 802 includes a plurality of panels 804a-804f which may be folded together in a stowed configuration, and unfolded or extended in a deployed configuration. The flexible solar array 800 may further include a plurality of hinge pins 812 interposed between adjacent panels to hingedly couple the adjacent panels 804b-804f. In some embodiments, the hinge pins 812 are made of a material configured to enhance stiffness of the blanket material 802 in the location where adjacent panels are joined together. For example, the hinge pins 812 may be formed of a carbon fiber material which may improve blanket stiffness of the deployed flexible semi-conductive substrate blanket material 802. The aforementioned configuration is advantageous over conventional hinging mechanisms which traditionally employ a thin fiberglass material which provides minimal stiffness to the blanket material when deployed. In contrast, the hinge pins of the various embodiments described herein improve stiffness of the deployed blanket material and facilitate easier blanket panel integration during assembly.

In accordance with various embodiments, circuit paths 810a and 810b of the flexible solar array (e.g., series, parallel, or a combination thereof) may traverse the flexible semi-conductive substrate blanket material 802. For example, the circuit paths 810a and 810b electrically connect the solar cells 806a-806i together within the solar power supply network. The flexible semi-conductive substrate blanket material 802 is configured to (1) dissipate current across the power supply network to minimize solar arcing and (2) isolate power circuits (not shown) within the power supply network. The power circuits provide electrical capacity to operate a load, e.g., on a spacecraft. The power supply comes from the flexible solar array 800. In some embodiments, the flexible semi-conductive substrate blanket material 802 isolates the power circuits from undesirable energy spikes (e.g., arcing). Otherwise, the power circuits are subject to the undesirable energy spikes. The circuit paths 810a and 810b, and the corresponding solar cells may be part of or coupled to the power circuits.

For example, the solar cells 806a-806i in each of the panels 804a-804f may be coupled to each other in accordance with a series or parallel configuration to form a string of cells in the respective set of solar cells. Similarly, a series connected set of solar cells or panels forms a string of solar cells. For example, the sets of solar cells 804a, 804c and 804e may be connected in series to form a first string. Similarly, the sets of solar cells 804b, 804d and 804f may be connected in series to form a second string. The combination of series and parallel connections may lead to several problems in solar arrays. One potential problem is that the solar array 800 or a subset of the solar cells in the solar array 800 may be subjected to undesirable energy spikes (e.g., arcing).

B. On-Panel Blocking Diodes

In accordance with various embodiments, the flexible solar array 800 includes a series of blocking diodes (e.g., blocking diodes 814a-814f) disposed on the flexible semi-conductive substrate blanket material 802 within the electrically conductive circuit paths 810a and 810b. For example, the blocking diodes 814a-814f prevent damage to the flexible solar array 800 in the presence of the arc or undesirable energy spike. The blocking diodes 814a-814f prevent the solar power supply network (including solar cells 806a-806i and/or the corresponding plurality of panels 804a-804f not affected by the arc or undesirable energy spike) from back feeding (power, current or voltage) into the one string of cells that has a trigger arc or undesirable energy spike. The diodes may be positioned on the panels 804a-804f or between the modules panels 804a-804f. The aforementioned configuration is advantageous over conventional solar arrays which traditionally utilize bypass diodes positioned in a separate discreet box below the blanket material. Placing the diodes on the flexible solar array panel provides the advantage of improving thermal dissipation by avoiding the concentrated heat of a diode box, and decreasing complexity by allowing the solar array designer to combine strings into circuits while on the array without having to individually wire each string to the base, which might otherwise require a few hundred conductors, rather than a few dozen. In contrast, conventional flexible arrays traditionally place such diodes, if any, at the base of the solar array in a discreet box.

III. Deployment of Solay Array

Figure 9A:
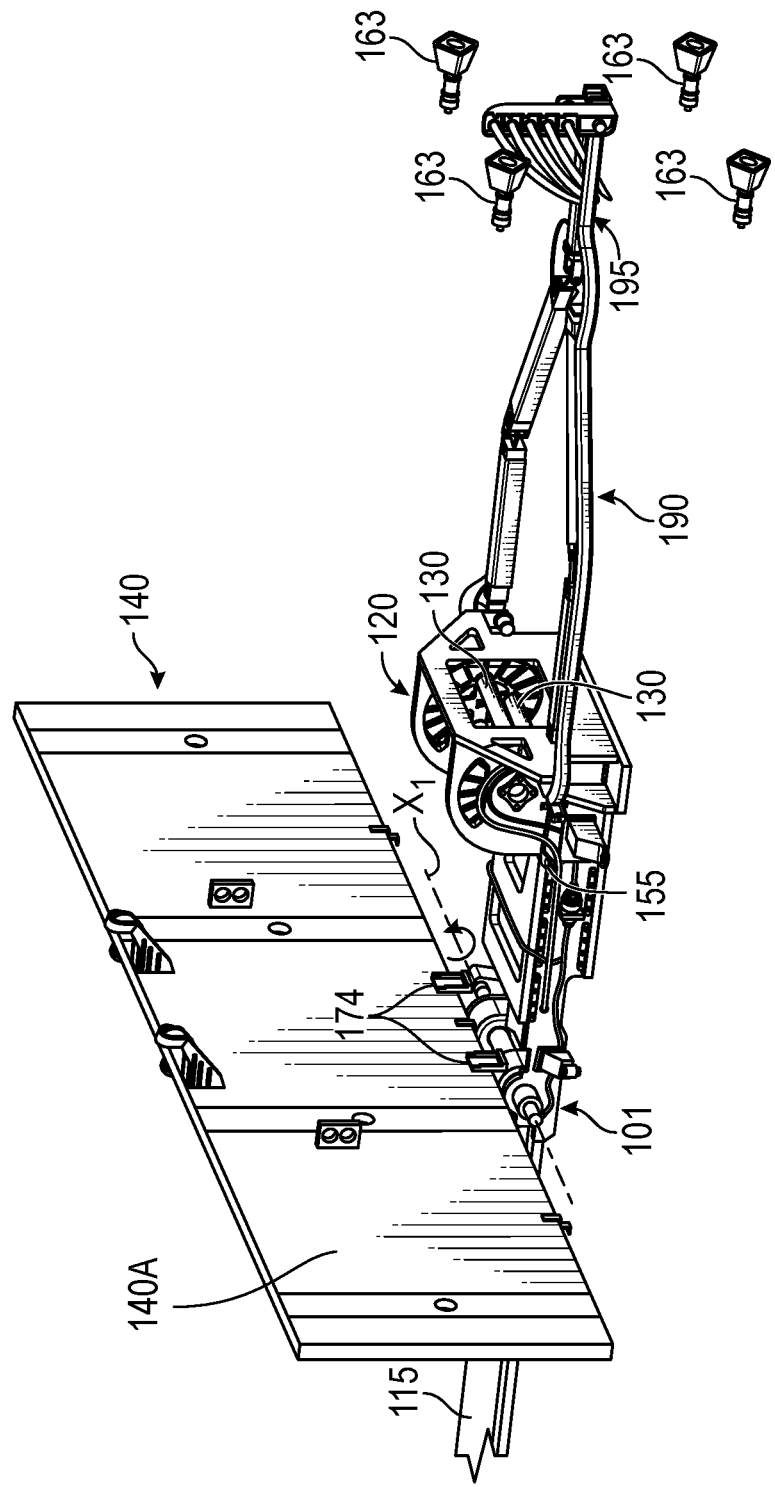
FIG. 9A is a perspective view illustrating a solar array deployment assembly including a boom and yoke for deploying the system of FIG. 1, according to some embodiments of the present disclosure.
Figure 9B:
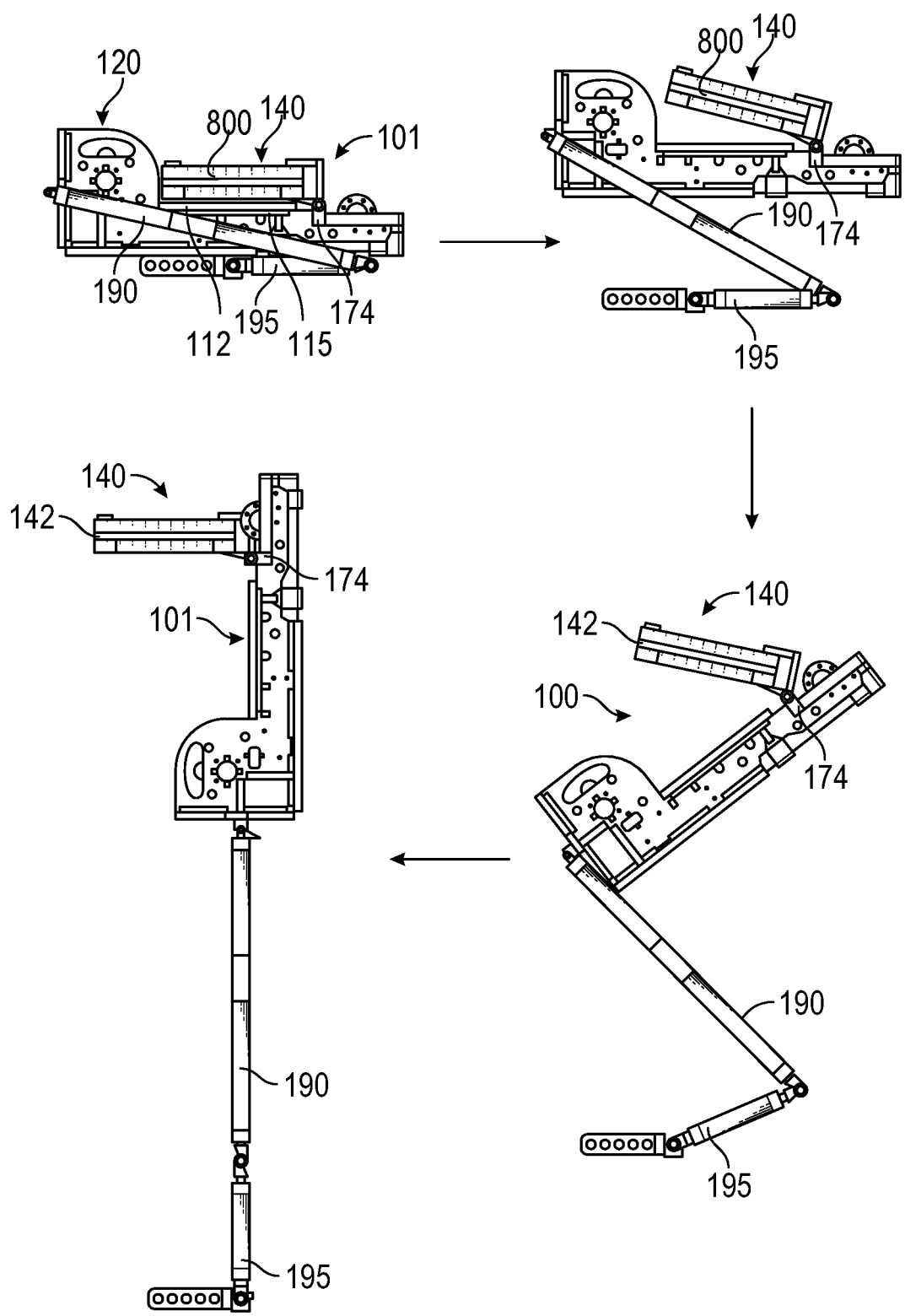
FIG. 9B illustrates a first deployment phase of the assembly of FIG. 9A, according to some embodiments of the present disclosure.
Figure 9C:
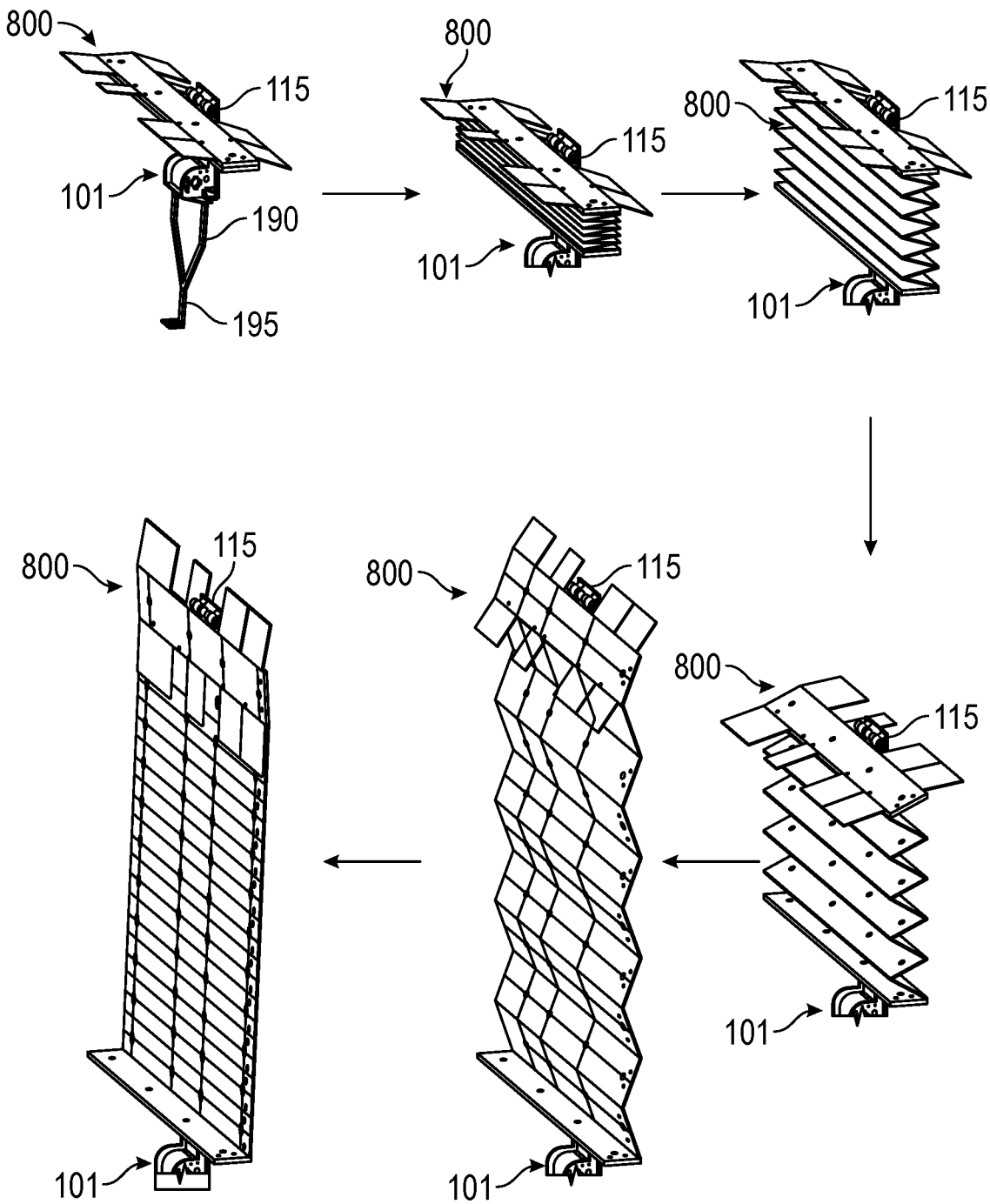
FIG. 9C illustrates a second deployment phase of the assembly of FIG. 9A, according to some embodiments of the present disclosure.

FIG. 9A is a perspective view illustrating a solar array deployer assembly including a boom and yoke for deploying the system of FIG. 1, according to some embodiments of the present disclosure. FIG. 9B illustrates a first deployment phase of the assembly of FIG. 9A, according to some embodiments of the present disclosure. FIG. 9C illustrates a second deployment phase of the assembly of FIG. 9A, according to some embodiments of the present disclosure. In accordance with various embodiments, as illustrated in FIGS. 9A-9C, a method of deploying the stowed solar array (MMA) includes a first phase and a second phase.

The first phase begins with the solar array system (multi-mission modular array (MMA)) in the stowed state, as it would be folded against the side of a spacecraft not shown). In some embodiments, the solar array is held to the spacecraft by several Launch Restraint Assemblies (LRAs) 163 (illustrated in FIG. 9A). In the stowed position, the blanket container 140 is disposed lying flat on the second section 112 of the frame 110 in a compact configuration. In accordance with some aspects, the LRAs are released. Hinges are located on the boom 195 and yoke 190 to deploy the LRAs 163 and the solar array system 100 away from the spacecraft. The blanket container 140 is then rotated about the hinge 174 to translate the blanket container 140 to an orientation perpendicular to the second section 112 of the frame 110. At the end of the first phase, the boom 195 and the yoke 190 are fully deployed. The first phase places the mast 115 and blanket container 140 away from the side of the spacecraft, which enables the spacecraft payload panel (to which the solar array was originally restrained) to thermally radiate and cool the payload electronics devices. The first phase also positions the blanket container 140 so that the second phase, the active deployment of the solar panels of the flexible semi-conductive substrate blanket material, may begin.

The second phase begins with deployment of the flexible solar array 800 from the blanket container 140. As illustrated, the mast is then deployed using the actuators (illustrated in FIG. 9A) and in turn deploys the panels of the solar array in a Z-unfolding manner. The mast continues to deploy the flexible blanket material 802 of the solar array 800 until unfolding of the Z-shaped solar array is completed. The second phase is complete when the mast has tensioned the deployed blanket structurally by pulling it between the mast tip and a lower tension bar of the solar array system (not shown).

A reference to an element in the singular is not intended to mean one and only one unless specifically so stated, but rather one or more. For example, a clock signal may refer to one or more clock signals, a control signal may refer to one or more control signals, an input signal may refer to one or more input signals, an output signal may refer to one or more output signals, and a signal may refer to differential voltage signals.

Unless specifically stated otherwise, the term some refers to one or more. Pronouns in the masculine (e.g., his) include the feminine and neuter gender (e.g., her and its) and vice versa. Headings and subheadings, if any, are used for convenience only and do not limit the invention.

The word exemplary is used herein to mean serving as an example or illustration. Any aspect or design described herein as exemplary is not necessarily to be construed as preferred or advantageous over other aspects or designs. In one aspect, various alternative configurations and operations described herein may be considered to be at least equivalent.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

In one aspect, unless otherwise stated, all measurements, values, ratings, positions, magnitudes, sizes, and other specifications that are set forth in this specification, including in the figures, are approximate, not exact. In one aspect, they are intended to have a reasonable range that is consistent with the functions to which they relate and with what is customary in the art to which they pertain. In one aspect, some of the dimensions are for clarity of presentation and are not to scale.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

A phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

In one or more aspects, the terms "substantially" and "approximately" may provide an industry-accepted tolerance for their corresponding terms and/or relativity between items. Such an industry-accepted tolerance may range from less than one percent to 20 percent.

Various items may be arranged differently (e.g., arranged in a different order, or partitioned in a different way) all without departing from the scope of the subject technology. In one aspect of the disclosure, the elements illustrated in the accompanying figures may be performed by one or more modules or sub-modules.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. Some or all of the steps, operations, or processes may be performed automatically, without the intervention of a user. The accompanying figures may present elements of various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

All structural and functional equivalents to the elements of the various aspects described throughout this disclosure that are known or later come to be known to those of ordinary skill in the art are expressly incorporated herein by reference. Moreover, nothing disclosed herein is intended to be dedicated to the public regardless of whether such disclosure is explicitly recited in claims. No element is to be construed under the provisions of 35 U.S.C. § 112, sixth paragraph, unless the element is expressly recited using a phrase means for or, in the case of a method claim, the element is recited using the phrase step for. Furthermore, to the extent that the term include, have, or the like is used, such term is intended to be inclusive in a manner similar to the term comprise as comprise is interpreted when employed as a transitional word in a claim.

The Title, Background, and Abstract of the disclosure are hereby incorporated into the disclosure and are provided as illustrative examples of the disclosure, not as restrictive descriptions. It is submitted with the understanding that they will not be used to limit the scope or meaning of the disclosure. In addition, in the Detailed Description, it can be seen that the description provides illustrative examples and the various features are grouped together in various embodiments for the purpose of streamlining the disclosure. This method of disclosure is not to be interpreted as reflecting an intention that the disclosed subject matter requires more features than are expressly recited in claims of any application claiming priority hereto.

What is claimed is:

1. A system for compact stowage and deployment of a solar array, the system comprising;
   a deployer unit comprising:
      a frame having a first section extending along a vertical plane and a second section extending along a horizontal plane;
      a closed-section collapsible mast for deploying and supporting the solar array;
      a mast stowage reel for compactly stowing the closed-section collapsible mast in a collapsed stowed state, the mast stowage reel comprising a pair of wheels interposed by a plurality of rods coupling the pair of wheels to each other, the closed-section collapsible mast configured to be reeled about the plurality of rods in the stowed state; and
      an actuator coupled to the closed-section collapsible mast to drive the closed-section collapsible mast from the collapsed stowed state to an expanded deployed state; and
   a blanket container for containing the flexible solar array, the blanket container being pivotably coupled to the frame of the deployer unit, wherein:
      in a stowed state of the blanket container, the blanket container is oriented facing the second section of the frame; and in a deployed state of the blanket container, the blanket container is oriented parallel to the vertical plane, and perpendicular to a longitudinal axis of the closed-section collapsible mast.

2. The system of claim 1, further comprising a constraint band to prevent the closed-section collapsible mast stowed on the stowage reel from unreeling prior to deployment, the constraint band configured to be tensioned uniformly by a constant force spring system.

3. The system of claim 1, wherein the closed-section collapsible mast comprises first and second mast shells bonded to each other to form the closed cross-section having a lenticular cross-sectional shape capable of withstanding both torsional and bending loads.

4. The system of claim 3, wherein each of the first and second mast shells comprises a carbon fiber composite material.

5. The system of claim 4, wherein the carbon fiber composite material is cured with a continuous layer of carbon fiber cloth to minimize occurrence of lengthwise splices across the closed-section mast.

6. The system of claim 1, wherein the mast stowage reel further comprises a latch having a first end and a second end, the first end configured to engage at least one of the wheels of the mast stowage reel to prevent rotation of the stowage reel prior to launch.

7. The system of claim 6, wherein the at least one wheel comprises a notch surface including at least one notch and the first end of the latch comprises a pin configured to fit in the notch to engage the at least one wheel.

8. The system of claim 7, wherein in the stowed state of the blanket container, at least a portion of the blanket container is disposed on the second end of the latch to impart a force thereto to maintain engagement of the pin in the notch.

9. The system of claim 1, further comprising a sleeve for anchoring the closed-section collapsible mast in the deployed state, the sleeve being configured to support at least a portion of the mast at a plurality of positions along a length thereof to strengthen the deployed closed-section collapsible mast.

10. The system of claim 9, wherein the sleeve is lined with a material configured to reduce friction between the closed-section collapsible mast and the sleeve.

11. The system of claim 10, wherein the material configured to reduce friction between the mast and the sleeve comprises Teflon.

\* \* \* \* \*